US011251024B2

United States Patent
Tseng et al.

(10) Patent No.: US 11,251,024 B2
(45) Date of Patent: Feb. 15, 2022

(54) COATING FOR CHAMBER PARTICLE REDUCTION

(71) Applicant: Applied Materials, Inc., Santa Clara, CA (US)

(72) Inventors: Hsin-wei Tseng, San Jose, CA (US); Casey Jane Madsen, San Jose, CA (US); Yikai Chen, San Jose, CA (US); Irena Wysok, San Jose, CA (US); Halbert Chong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/933,926

(22) Filed: Jul. 20, 2020

(65) Prior Publication Data

US 2021/0043429 A1 Feb. 11, 2021

Related U.S. Application Data

(60) Provisional application No. 62/882,798, filed on Aug. 5, 2019.

(51) Int. Cl.
*H01J 37/32* (2006.01)
*C23C 14/06* (2006.01)
(Continued)

(52) U.S. Cl.
CPC .... *H01J 37/32504* (2013.01); *C23C 14/0605* (2013.01); *C23C 14/3407* (2013.01);
(Continued)

(58) Field of Classification Search
None
See application file for complete search history.

(56) References Cited

U.S. PATENT DOCUMENTS

| 5,701,228 A | 12/1997 | Ishii |
| 5,837,357 A * | 11/1998 | Matsuo ............ G11B 5/72 |
| | | 428/212 |

(Continued)

FOREIGN PATENT DOCUMENTS

| JP | 2002306957 A | 10/2002 |
| KR | 20170042359 A | 4/2017 |

OTHER PUBLICATIONS

International Search Report and Written Opinion for PCT/US2020/042582 dated Nov. 6, 2020.

*Primary Examiner* — Jason Berman
(74) *Attorney, Agent, or Firm* — Patterson + Sheridan, LLP

(57) ABSTRACT

Embodiments generally relate to a chamber component to be used in plasma processing chambers for semiconductor or display processing. In one embodiment, a chamber component includes a textured surface having a surface roughness ranging from about 150 microinches to about 450 microinches and a coating layer disposed on the textured surface. The coating layer may be a silicon layer having a purity ranging from about 90 weight percent to about 99 weight percent, a thickness ranging from about 50 microns to about 500 microns, and an electrical resistivity ranging from about 1 E-3 ohm*m to about 1 E3 ohm*m. The coating layer provides strong adhesion for materials deposited in the plasma processing chamber, which reduces the materials peeling from the chamber component. The coating layer also enables oxygen plasma cleaning for further reducing materials deposited on the chamber component and provides the protection of the textured surface located therebelow.

17 Claims, 2 Drawing Sheets

(51) Int. Cl.
  *C23C 14/35* (2006.01)
  *H01J 37/34* (2006.01)
  *C23C 14/34* (2006.01)

(52) U.S. Cl.
  CPC ........ *C23C 14/35* (2013.01); *H01J 37/32477* (2013.01); *H01J 37/32495* (2013.01); *H01J 37/3405* (2013.01); *H01J 37/3426* (2013.01); *H01J 37/32082* (2013.01); *H01J 2237/332* (2013.01)

(56) References Cited

U.S. PATENT DOCUMENTS

| | | | |
|---|---|---|---|
| 9,437,397 B2* | 9/2016 | Blake | C23C 16/50 |
| 2003/0026917 A1* | 2/2003 | Lin | H01J 37/32458 427/453 |
| 2003/0185965 A1 | 10/2003 | Lin et al. | |
| 2004/0206804 A1* | 10/2004 | Kim | C23C 16/4401 228/199 |
| 2007/0056688 A1 | 3/2007 | Kim et al. | |
| 2011/0265821 A1* | 11/2011 | Tay | H01J 37/32477 134/10 |
| 2014/0120341 A1 | 5/2014 | Kharchenko et al. | |
| 2018/0076010 A1 | 3/2018 | Sheelavant et al. | |

* cited by examiner

COATING FOR CHAMBER PARTICLE REDUCTION

CROSS-REFERENCE TO RELATED APPLICATIONS

This application claims priority to U.S. Provisional Patent Application Ser. No. 62/882,798, filed on Aug. 5, 2019, which herein is incorporated by reference.

BACKGROUND

Field

Embodiments of the present disclosure generally relate to a chamber component to be used in plasma processing chambers for semiconductor or display processing.

Description of the Related Art

A plasma processing chamber may be used to process a substrate in an energized process gas, such as a plasma, to manufacture electronic circuits, such as integrated circuit chips and displays. Typically, the processing chamber includes an enclosure wall that encloses a process zone into which a process gas is introduced, a gas energizer to energize the process gas, and an exhaust system to exhaust and control the pressure of the process gas in the chamber. The processing chamber may, for example, be used to deposit a material on a substrate. For example, the chamber may be a physical vapor deposition (PVD) chamber used to deposit a material onto the substrate, such as a metal for example, aluminum, copper, tungsten, or tantalum; or a carbon compound such as diamond like carbon (DLC).

The material can deposit on chamber components that are exposed in the chamber, such as the surfaces of a chamber sidewall, ceiling, liner, or deposition ring. When a high stress material, such as carbon, DLC, or tungsten, the material deposited on chamber component can peel from the chamber component to form particles in the chamber, which can contaminate the material formed on the substrate.

Therefore, there is a need for an improved chamber component.

SUMMARY

Embodiments of the present disclosure generally relate to a chamber component to be used in plasma processing chambers for semiconductor or display processing. In one embodiment, a chamber component to be used in a plasma processing chamber includes a body having a textured surface, and the textured surface has a surface roughness ranging from about 150 microinches to about 450 microinches. The chamber component further includes a coating layer disposed on the textured surface, the coating layer comprising a silicon layer having a purity ranging from about 90 weight percent to about 99 weight percent, a thickness ranging from about 50 microns to about 500 microns, and an electrical resistivity ranging from about 1 E-3 ohm*m to about 1 E3 ohm*m.

In another embodiment, a chamber component to be used in a plasma processing chamber includes a body having a first textured surface, and the first textured surface has a first plurality of protrusions, each protrusion of the first plurality of protrusions having a height ranging from about 0.005 inches to about 0.02 inches and a width ranging from about 0.016 inches to about 0.15 inches. Each protrusion of the first plurality of protrusions includes a second textured surface having a surface roughness ranging from about 150 microinches to about 450 microinches. The chamber component further includes a coating layer disposed on the first textured surface, the coating layer comprising a silicon layer.

In another embodiment, a physical vapor deposition chamber including a chamber body and a chamber component disposed in the chamber body. The chamber component includes a body having a textured surface, and the textured surface has a surface roughness ranging from about 150 microinches to about 450 microinches. The chamber component further includes a coating layer disposed on the textured surface, the coating layer comprising a silicon layer having a purity ranging from about 90 weight percent to about 99 weight percent, a thickness ranging from about 50 microns to about 500 microns, and an electrical resistivity ranging from about 1 E-3 ohm*m to about 1 E3 ohm*m.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a chamber component to be used in plasma processing chambers for semiconductor or display processing. In one embodiment, a chamber component includes a textured surface having a surface roughness ranging from about 150 microinches to about 450 microinches and a coating layer disposed on the textured surface. The coating layer may be a silicon layer having a purity ranging from about 90 weight percent to about 99 weight percent, a thickness ranging from about 50 microns to about 500 microns, and an electrical resistivity ranging from about 1 E-3 ohm*m to about 1 E3 ohm*m. The coating layer provides strong adhesion for materials deposited in the plasma processing chamber, which reduces the materials peeling from the chamber component. The coating layer also enables oxygen plasma cleaning for further reducing materials deposited on the chamber component and provides the protection of the textured surface located therebelow.

Figure 1:
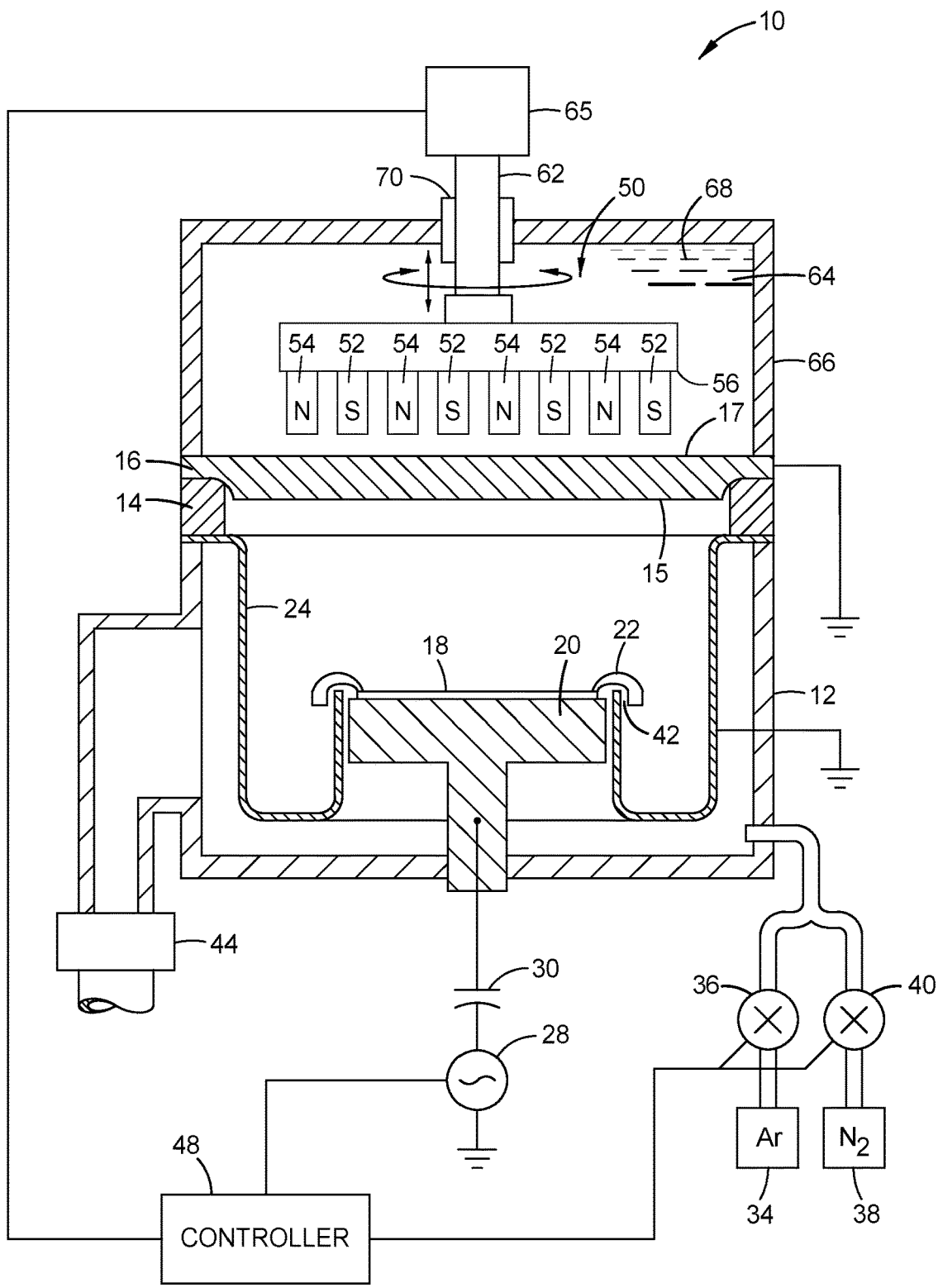
FIG. 1 is a schematic cross-sectional side view of a PVD chamber.

FIG. 1 is a schematic cross-sectional side view of a PVD chamber 10. The chamber 10 includes a vacuum chamber body 12 sealed through a ceramic insulator 14 to a sputtering target 16. The target 16 has at least a first surface 15 facing a substrate 18 and a second surface 17 opposite the first surface 15. The first surface 15 of the target 16 is composed of a material, such as a metal or carbon, to be sputter deposited onto a surface of the substrate 18 disposed on a substrate support 20 disposed in the chamber body 12. The substrate 18 may be secured by a substrate clamp 22. Alternatively to the substrate clamp 22, a cover ring or an electrostatic chuck may be incorporated into the substrate support 20 for securing the substrate 18. In one embodiment, the target material may be aluminum, copper, titanium, tantalum, cobalt, tungsten, nickel, molybdenum, alloys of these metals containing up to 45 percent by atomic percent (at %) of an alloying element, or other metals and metal alloys amenable to DC sputtering. On the other hand, RF sputtering may be used to sputter material from a dielectric target. In another embodiment, the target material is carbon.

A grounded shield 24 is disposed within the chamber body 12 for protecting the chamber body 12 from the sputtered material. The shield 24 also provides a grounded anode. An RF power supply 28 may be coupled to an electrode (not shown) embedded in the substrate support 20 through an AC capacitive coupling circuit 30 to allow the substrate support 20 to develop a DC self-bias voltage in the presence of a plasma. A negative DC self-bias attracts positively charged sputter ions created in a high-density plasma deeply into a high aspect-ratio holes characteristic of advanced integrated circuits.

A first gas source 34 supplies a sputtering working gas, such as argon, to the chamber body 12 through a mass flow controller 36. In some embodiments, a second gas source 38 may be utilized to supply a second gas, such as nitrogen gas, to the chamber body 12. The gases can be introduced from various positions within the chamber body 12. For example, one or more inlet pipes located near the bottom of the chamber body 12 supply gas at the back of the shield 24. The gas penetrates through an aperture at the bottom of the shield 24 or through a gap 42 formed between the substrate clamp 22 and the shield 24. A vacuum pumping system 44 connected to the chamber body 12 through a wide pumping port maintains the interior of the chamber body 12 at a low pressure. A computer based controller 48 controls components of the chamber 10 including the RF power supply 28 and the mass flow controllers 36, 40.

To provide efficient sputtering, a magnetron 50 is disposed above the target 16. The magnetron 50 may be disposed in a magnetron cavity 64 defined by a coolant chamber 66 positioned above the target 16. The magnetron 50 includes a plurality of magnets 52, 54 to produce a magnetic field within the chamber body 12. The plurality of magnets 52, 54 may be coupled by a backing plate 56. Each magnet 52 may be arranged so one pole is facing the target 16, and each magnets 54 may be arranged so the other pole is facing the target 16. For example, as shown in FIG. 1, each magnet 52 is arranged so the south pole is facing the target 16, and each magnet 54 is arranged so the north pole is facing the target 16. The magnets 52 and magnets 54 may be alternately arranged along a longitudinal dimension (in the X-axis direction) of the magnetron 50, as shown in FIG. 1. In some embodiments, a pair of adjacent magnets 52, 54 may be replaced with a single U shaped magnet, and the magnetron 50 includes a plurality of U shaped magnets. The magnetron 50 is coupled to a shaft 62 driven by a motor 65. The motor 65 may be also capable of moving the magnetron 50 along the Z-axis and rotate about the shaft 62.

To counteract the large amount of power delivered to the target 16, the back of the target 16 may be sealed to the coolant chamber 66, which encloses the magnetron cavity 64. The coolant chamber 66 may include a coolant 68, such as chilled deionized water, to cool the target 16 and/or magnetron 50. The magnetron 50 is immersed in the coolant 68, and the shaft 62 passes through the coolant chamber 66 through a rotary seal 70.

Figure 2A:
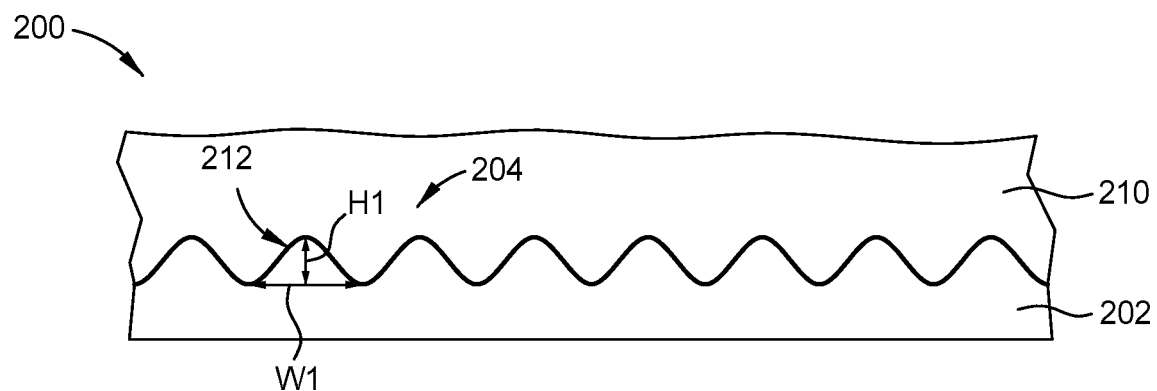
FIGS. 2A and 2B are schematic cross-sectional side views of a chamber component having a coating layer.
Figure 2B:
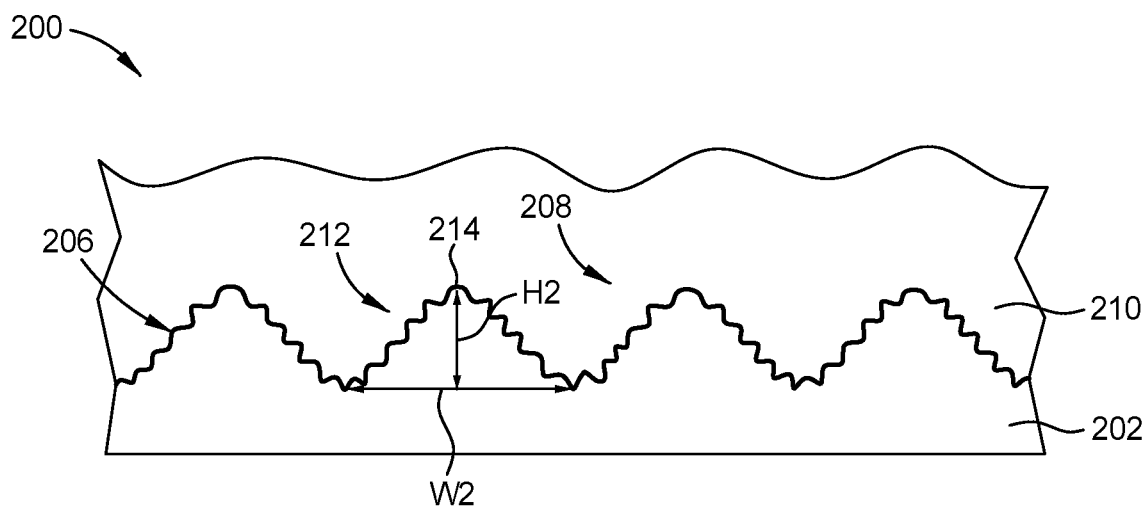

FIGS. 2A and 2B are schematic cross-sectional side views of a chamber component 200 having a coating layer 210. The chamber component 200 may be any chamber component in a plasma processing chamber. In one embodiment, the chamber component 200 is a chamber component in a PVD chamber configured to deposit a high stress material, such as carbon, DLC, tungsten, or arsenic doped material on a substrate disposed in the PVD chamber. The chamber component 200 may be a chamber component in a plasma processing chamber, such as a chemical vapor deposition (CVD) chamber or plasma enhanced CVD (PECVD) chamber, configured to deposit the high stress material on a substrate in the plasma processing chamber. In one embodiment, the chamber component 200 is a chamber component in the PVD chamber 10 shown in FIG. 1. For example, the chamber component 200 may be the clamp 22, the shield 24, or substrate support 20.

As shown in FIG. 2A, the chamber component 200 includes a body 202 having a textured surface 204 and the coating layer 210 disposed on the textured surface 204. The body 202 may be fabricated from a metal, such as a stainless steel, aluminum, titanium, or other suitable metal, or other materials, such as ceramic, quartz, silicon carbide, or other suitable material. The textured surface 204 has a surface roughness ranging from about 150 microinches to about 450 microinches. The textured surface 204 includes a plurality of protrusions 212, and each protrusion 212 has a height H1 and a width W1. The height H1 and the width W1 are in hundreds of microinches. The textured surface 204 may be formed by any suitable method, such as grit blast. The textured surface 204 helps the coating layer 210 to adhere to the body 202.

The coating layer 210 is a silicon layer having a purity ranging from about 90 weight percent to about 99 weight percent, a thickness ranging from about 50 microns to about 500 microns, and an electrical resistivity ranging from about 1 E-3 ohm*m to about 1 E3 ohm*m. The coating layer 210 may be doped to achieve the predetermined electrical resistivity. The coating layer 210 may be doped with a dopant such as aluminum, magnesium, boron, tungsten, carbon, or other suitable dopant. For example, the coating layer 210 may be a SiC composite coating. The coating layer 210 may have SiC particles with about 20% yittria and aluminum particle powder mixed in. In other examples, the coating layer 210 may be a boron carbide (B4C) coating. The coating layer 210 may be pure boron carbide powder with mix percentage of carbon mixed therein with the boron carbide powder. The coatings incorporate sputtering materials on the shield 24, cover ring, deposition ring, and/or shutter disk. The coating layer 210 reduces high damage particles, such as Al, from entering upon the substrates which in turn improves device yield as, even when the process kits flake contamination material, the material is such that it won't damage the substrates 18 significantly.

The roughness of the coating layer 210 may be depend on the roughness of the textured surface 204. The coating layer 210 may have a surface roughness ranging from about 100 microinches to about 800 microinches. The coating layer 210 may be formed by any suitable method, such as plasma spraying of silicon powder. The coating layer 210 provides strong adhesion for materials, such as high stress materials, deposited in the plasma processing chamber, which reduces the materials peeling from the chamber component. The coating layer 210 also enables oxygen plasma cleaning for further reducing materials deposited on the chamber component and provides the protection of the textured surface 204 located therebelow.

FIG. 2B is a schematic cross-sectional side view of the chamber component 200 having the coating layer 210 according to another embodiment. As shown in FIG. 2B, the body 202 of the chamber component 200 includes a textured surface 208. The textured surface 208 includes a plurality of protrusions 212, and each protrusion 212 has a height H2 and a width W2. The height H2 ranges from about 0.005 inches to about 0.02 inches, and the width W2 ranges from about 0.016 inches to about 0.15 inches. Each protrusion 212 has a textured surface 214, and the textured surface 214 includes the plurality of protrusions 206. The protrusions 206 may be referred to as micro-protrusions, and the protrusions 212 may be referred to as macro-protrusions, because the protrusions 212 are larger than the protrusion 206. In one embodiment, each protrusion 212 is larger than each protrusion 206 by three orders of magnitude. Thus, the textured surface 214 includes both macro-protrusions and micro-protrusions, and the textured surface 214 may be formed by more than one processes. In one embodiment, an electromagnetic energy beam scan is performed on the body 202 to form the plurality of protrusions 212, and a grit blast is performed on the body 202 to formed the plurality of protrusions 206 in each protrusion 212. The textured surface 214 helps the coating layer 210 to adhere to the body 202.

The coating layer 210 may be formed on the textured surface 214 of the body 202 by any suitable method, such as plasma spraying of silicon powder. The coating layer 210 provides strong adhesion for materials, such as high stress materials, deposited in the plasma processing chamber, which reduces the materials peeling from the chamber component. The coating layer 210 also enables oxygen plasma cleaning for further reducing materials deposited on the chamber component and provides the protection of the textured surface 214 located therebelow.

While the foregoing is directed to embodiments of the present disclosure, other and further embodiments of the disclosure may be devised without departing from the basic scope thereof, and the scope thereof is determined by the claims that follow.

What is claimed is:

1. A chamber component to be used in a plasma processing chamber, comprising:
a body having a textured surface, the textured surface having a surface roughness ranging from about 150 microinches to about 450 microinches; and
a coating layer disposed on the textured surface, the coating layer comprising a doped silicon layer having a purity ranging from about 90 weight percent to about 99 weight percent, a thickness ranging from about 50 microns to about 500 microns, and an electrical resistivity ranging from about 1E-3 ohm*m to about 1E3 ohm*m.

2. The chamber component of claim 1, wherein the body comprises a metal.

3. The chamber component of claim 2, wherein the body further comprises aluminum, stainless steel, or titanium.

4. The chamber component of claim 1, wherein the body comprises ceramic, quartz, or silicon carbide.

5. The chamber component of claim 1, wherein the doped silicon layer is doped with aluminum, magnesium, boron, tungsten, or carbon.

6. The chamber component of claim 1, wherein the textured surface is formed by grit blast.

7. The chamber component of claim 6, wherein the coating layer is formed by plasma spray.

8. A chamber component to be used in a plasma processing chamber, comprising:
a body having a first textured surface, the first textured surface having a first plurality of protrusions, each protrusion of the first plurality of protrusions having a height ranging from about 0.005 inches to about 0.02 inches and a width ranging from about 0.016 inches to about 0.15 inches, each protrusion of the first plurality of protrusions including a second textured surface having a surface roughness ranging from about 150 microinches to about 450 microinches; and
a coating layer disposed on the first textured surface, the coating layer comprising a doped silicon layer.

9. The chamber component of claim 8, wherein the doped silicon layer is doped with aluminum, magnesium, boron, tungsten, or carbon.

10. The chamber component of claim 8, wherein the doped silicon layer having a purity ranging from about 90 weight percent to about 99 weight percent, a thickness ranging from about 50 microns to about 500 microns, and an electrical resistivity ranging from about 1E-3 ohm*m to about 1E3 ohm*m.

11. A physical vapor deposition chamber, comprising:
a chamber body; and
a chamber component disposed in the chamber body, the chamber component comprising:
a body having a textured surface, the textured surface having a surface roughness ranging from about 150 microinches to about 450 microinches; and
a coating layer disposed on the textured surface, the coating layer comprising a doped silicon layer having a purity ranging from about 90 weight percent to about 99 weight percent, a thickness ranging from about 50 microns to about 500 microns, and an electrical resistivity ranging from about 1E-3 ohm*m to about 1E3 ohm*m.

12. The physical vapor deposition chamber of claim 11, wherein the chamber component is a shield.

13. The physical vapor deposition chamber of claim 11, wherein the chamber component is a clamp.

14. The physical vapor deposition chamber of claim 11, wherein the chamber component is a substrate support.

15. The physical vapor deposition chamber of claim 11, further comprising a carbon target disposed in the chamber body.

16. The physical vapor deposition chamber of claim 11, wherein the doped silicon layer is doped with aluminum, magnesium, boron, tungsten, or carbon.

17. The physical vapor deposition chamber of claim 11, wherein the doped silicon layer has a surface roughness ranging from about 100 microinches to about 800 microinches.

* * * * *